(12) United States Patent
Hirai et al.

(10) Patent No.: US 6,365,915 B1
(45) Date of Patent: *Apr. 2, 2002

(54) THIN FILM TRANSISTOR

(75) Inventors: Kyoko Hirai, Hashima; Yushi Jinno, Gifu, both of (JP)

(73) Assignee: Sanyo Electric Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/274,124

(22) Filed: Mar. 23, 1999

(30) Foreign Application Priority Data

Mar. 26, 1998 (JP) .............................. 10-078771

(51) Int. Cl.[7] .................... H01L 29/04; G02F 1/1343
(52) U.S. Cl. .................. 257/59; 257/72; 349/43
(58) Field of Search .............. 257/57, 59, 66, 257/72, 347; 349/43, 44, 42

(56) References Cited

U.S. PATENT DOCUMENTS

| | | | |
|---|---|---|---|
| 5,200,846 A | * 4/1993 | Hiroki et al. | 349/43 |
| 5,499,123 A | * 3/1996 | Mikoshiba | 349/44 |
| 5,548,153 A | 8/1996 | Muragishi | 257/365 |
| 5,644,146 A | 7/1997 | Arai et al. | 257/66 |
| 5,754,261 A | 5/1998 | Lyu | 349/44 |
| 5,784,132 A | * 7/1998 | Hashimoto | 349/44 |
| 5,796,116 A | 8/1998 | Nakata et al. | 257/72 |
| 5,955,765 A | 9/1998 | Yamazaki et al. | 257/365 |
| 5,834,797 A | 11/1998 | Yamanaka | 257/57 |
| 5,965,916 A | 10/1999 | Chen | 257/72 |
| 5,966,193 A | 10/1999 | Zhang et al. | 349/110 |
| 5,990,491 A | * 11/1999 | Zhang | 257/57 |
| 6,034,747 A | 3/2000 | Tanaka et al. | 349/43 |

* cited by examiner

Primary Examiner—Minh Loan Tran
(74) Attorney, Agent, or Firm—Cantor Colburn LLP

(57) ABSTRACT

In a thin film transistor (TFT), a gate electrode, a gate insulating film, a poly silicon film having a channel, a stopper insulating film on the channel, an interlayer insulating film, a source electrode and a drain electrode, a planarizating film, and a transparent electrode are formed on an insulating substrate in that order. In this TFT, either of the source electrode and the drain electrode or the transparent electrode is formed on the interlayer insulating film or the planarizating film spreading over the channel. This will restrain the occurrence of a back channel resulting from polarization in the planarizating film or the interlayer insulating film in the TFT caused by water or impurity ions, or variation of a threshold voltage of the TFT when a back channel occurs. As a result, TFTs and liquid crystal displays which have few defects and can perform display having uniform brightness all over can be provided.

4 Claims, 4 Drawing Sheets

THIN FILM TRANSISTOR

BACKGROUND OF THE INVENTION

1. Field of the Invention

This invention relates to a thin film transistor (TFT) having a planarizating film and to a liquid crystal display (LCD) having such a TFT as a switching element.

2. Description of the Prior Art

TFTs having a poly silicon film as an active layer have been developed as a driver element or a pixel driving element for use in active-matrix LCDs. An LCD having a conventional TFT will be described below.

FIG. 1 is a plan view of a conventional TFT used in a pixel section; FIG. 2 is a cross-sectional view along C—C line in FIG. 1 of an LCD using such a TFT. As shown in FIG. 1, the TFT in the pixel section is formed near the intersection of gate signal line G for providing gate signals and drain signal line D for providing image signals and its source is connected to a display electrode.

The structure of such a TFT will be described with reference to FIG. 2.

A gate electrode 2 made of a refractory metal (a high melting point metal), such as chromium (Cr) and molybdenum (Mo), a gate insulating film 3, and an active layer 4 made of a poly silicon film are formed in that order on an insulating substrate 1 made of quartz glass, non-alkali glass, or the like. In the active layer 4, a channel 7 is formed over the gate electrode 2 and a source 5 and a drain 6 are formed with the channel 7 between by ion implantation with a stopper 8 on the channel 7 as a mask.

An interlayer insulating film 12 consisting of an $SiO_2$ film 9, an SiN film 10, and an $SiO_2$ film 11 layered in that order is formed entirely over the complete gate insulating film 3, active layer 4, and stopper 8. Furthermore, a drain electrode 33 is formed by filling a contact hole made in the interlayer insulating film 12, the position of which corresponds to the drain 6, with a metal, such as Al. In addition, a planarizating film 15 made of, for example, an organic resin for planarizating the surface is formed entirely over it. A contact hole, the position of which corresponds to the source 5, is made in the planarizating film 15. Furthermore, a transparent electrode 36, which also serves as a source electrode 34, made of ITO (indium tin oxide) being in contact with the source 5 via this contact hole is formed on the planarizating film 15.

The insulating substrate 1 on which the TFT so formed and an opposite substrate 17 having electrodes, etc. (not shown) opposite to the insulating substrate 1 are bonded together at their edges with a sealing adhesive 18 and a vacant space formed is filled with liquid crystal 19.

In the structure of such a conventional TFT, however, impurities or impurity ions generated when the sealing adhesive hardens, water or impurity ions included in the liquid crystal 19 being in contact with the planarizating film 15, water permeating from the outside through a gap 20 occurring in the sealed portion, water included in the air coming in contact with the planarizating film 15, or other substance attaches to the surface of the planarizating film 15, so that there occurs electric charge on the surface of the planarizating film 15 and polarization between the top and the bottom of the planarizating film 15 or each film of the interlayer insulating film 12 occurs.

Therefore, a back channel is formed in a TFT, resulting in the disadvantage of a change in a threshold voltage of the TFT. Furthermore, if such a TFT is used in an LCD, an increase in a threshold voltage of the TFT leads to a decrease in an ON-state current of the TFT and, for example, in a normally-white mode LCD a bright point defect may occur in which certain pixels remain always bright. Conversely, a decrease in a threshold voltage of the TFT leads to an increase in an OFF-state current of the TFT and possible dark point defects where pixels are insufficiently bright. As a result, image display is of poor quality. In addition, if a threshold voltage varies from TFT to TFT, there exists the disadvantage of being unable to obtain display having uniform brightness all over.

SUMMARY OF THE INVENTION

The present invention was made to overcome the above conventional disadvantages. That is, an object of the present invention is to provide an LCD which can display images with uniform brightness all over, by preventing polarization in a planarizating film or an interlayer insulating film of a TFT, stabilizing a threshold voltage of the TFT, and improving the bright point defect and others.

A TFT according to the present invention is a thin film transistor in which a gate electrode, a gate insulating film, a poly silicon film having a channel, an interlayer insulating film, a source electrode and a drain electrode, a planarizating film, and a transparent electrode are formed on an insulating substrate in that order. Either the source electrode or the drain electrode is formed on the interlayer insulating film so that it spreads over the channel, and/or the transparent electrode is formed on the planarizating film so that it spreads over the channel.

A TFT according to another aspect of the present invention is a thin film transistor in which a gate electrode, a gate insulating film, a poly silicon film having a channel, an interlayer insulating film, and a planarizating film are formed on a substrate in that order, a conductive film is formed on at least one of the interlayer insulating film and the planarizating film so that the conductive film covers an area over the channel, and potential of the conductive film is controlled to a predetermined value.

An LCD according to still another aspect of the present invention is one for displaying a desired image by driving liquid crystal sealed in between a pair of substrates and a substrate on which a thin film transistor is formed in the above way is used as one of the pair of substrates in this LCD. In addition, the upper surface of the planarizating film is placed opposite to the other of the pair of substrates with the liquid crystal between.

When a conductive film, such as a transparent electrode, is formed on the planarizating film so that the conductive film covers an area in the planarizating film over the channel, impurities will be prevented from attaching to an area of the planarizating film corresponding to the channel. When an area in the interlayer insulating film over the channel is covered with a conductive film, such as a source electrode or a drain electrode, polarization between the top and the bottom of the interlayer insulating film can be prevented. In addition, when the area of the planarizating film and/or the interlayer insulating film corresponding to the channel is covered with a conductive film, even if polarization occurs in the planarizating film and the potential is produced in the back channel portion of the thin film transistor, the potential of the back channel is shielded with the potential of the conductive film. Therefore, not only can the occurrence of a back channel be restrained, but, even if it occurs, variation in a threshold voltage of a TFT caused by it can be reduced. As a result, if such a TFT is used in, for example, an LCD, the bright point defect and other display defects caused by a back channel can be improved and the LCD can perform display having uniform brightness on its display surface.

DESCRIPTION OF THE PREFERRED EMBODIMENTS

A TFT according to the first embodiment of the present invention will be described below.
(First preferred embodiment)

Figure 1:
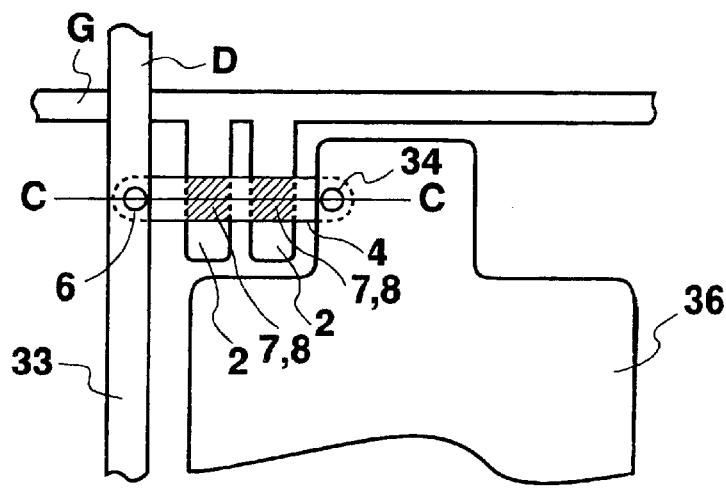
FIG. 1 is a plan view of a conventional TFT.
Figure 2:
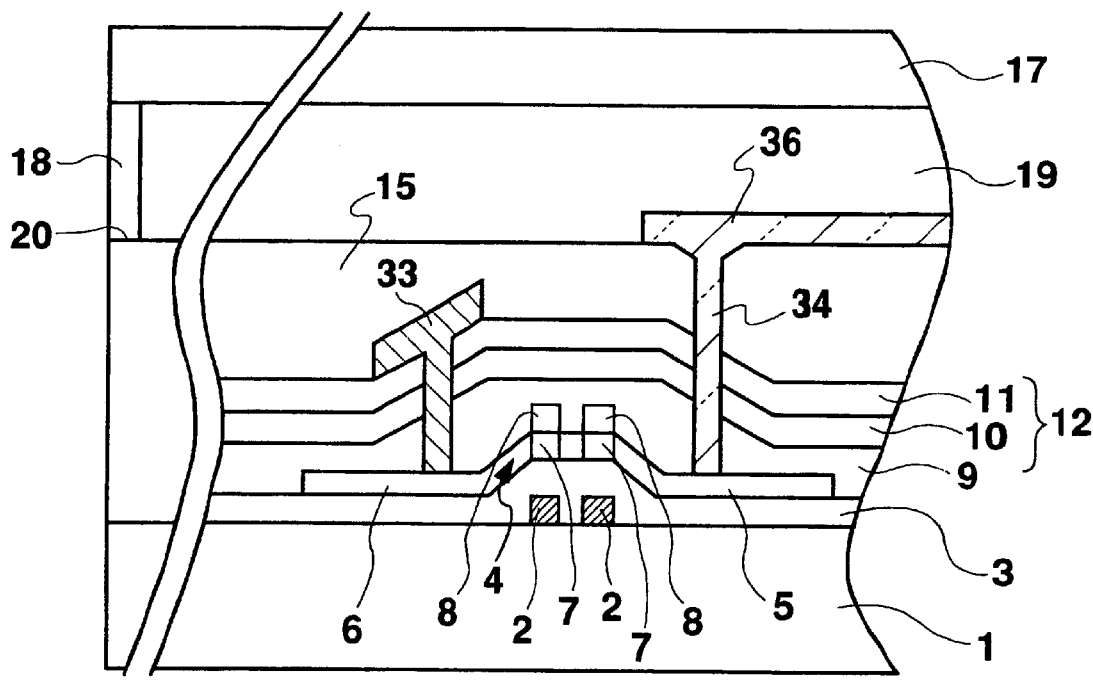
FIG. 2 is a cross-sectional view of a conventional LCD.
Figure 3:
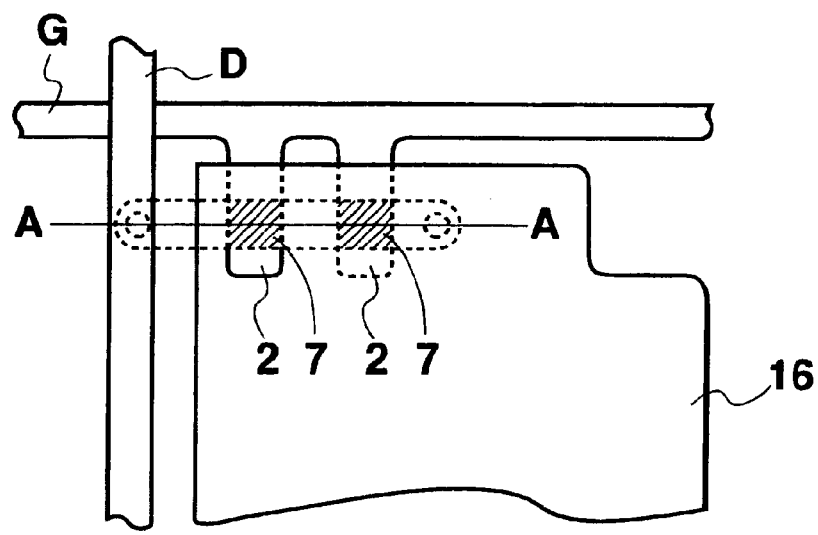
FIG. 3 is a plan view of a TFT in accordance with a first preferred embodiment of the present invention.
Figure 4:
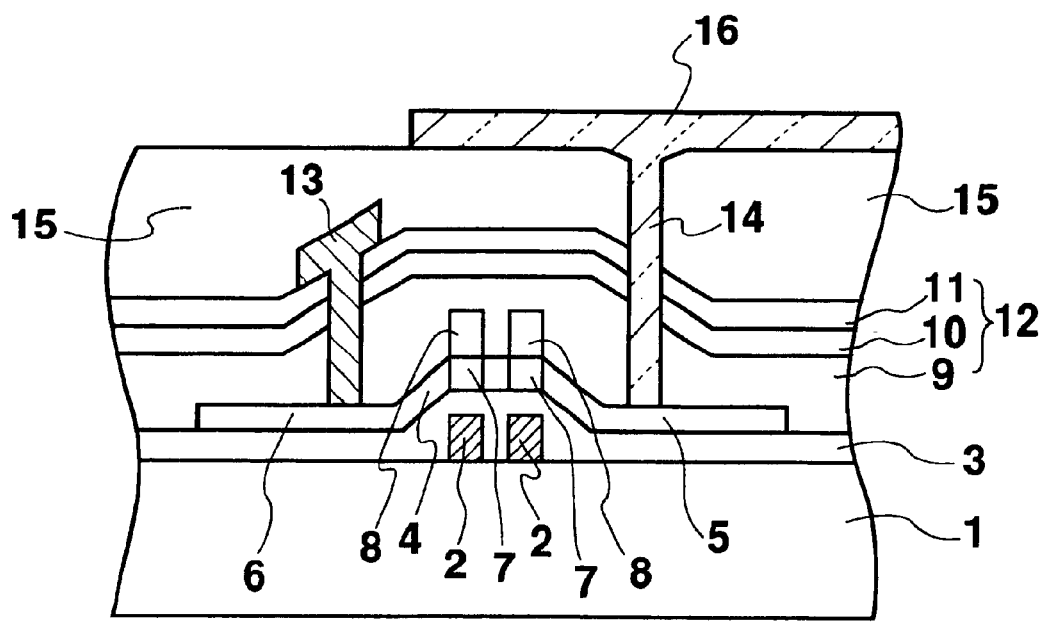
FIG. 4 is a cross-sectional view of a TFT of the present invention.

FIG. 3 is a plan view of a TFT according to the present invention; FIG. 4 is a cross-sectional view along A—A line in FIG. 3. As shown in FIG. 3, a TFT is formed near the intersection of a gate signal line and a drain signal line and is connected to a display electrode 16.

As shown in FIG. 4, a gate electrode 2 made of a refractory metal (a high melting point metal), such as Cr and Mo, a gate insulating film 3 made of an SiN film and an $SiO_2$ film, and an active layer 4 made of a poly silicon film are formed in that order on an insulating substrate 1 made of quartz glass, non-alkali glass, etc. In the active layer 4, a channel 7 is formed over the gate electrode 2 and a source 5 and a drain 6 are formed by ion implantation with the channel 7 between.

A stopper 8 made of an $SiO_2$ film is formed on the channel 7 so that it functions as a mask covering the channel 7 to prevent ions from entering the channel 7 when ion doping is performed to form the source 5 and the drain 6. An interlayer insulating film 12 consisting of an $SiO_2$ film 9, an SiN film 10, and an $SiO_2$ film 11 layered in that order is formed over the entire of the gate insulating film 3, the active layer 4, and the stopper 8. Furthermore, a drain electrode 13 is formed by filling a contact hole made in the interlayer insulating film 12 the position of which corresponds to the drain 6 with a metal, such as Al. In addition, a planarizating film 15 made of, for example, an organic resin is formed over the entire surface. A contact hole, the position of which corresponds to the source 5, is made in the planarizating film 15 and a display electrode 16, which is a transparent electrode, is formed. The display electrode 16 is made of a transparent conductive material, such as ITO, in contact with the source 5 and serving as a source electrode 14.

The display electrode 16 is formed so that it spreads over at least the channel 7, as shown in FIGS. 3 and 4. As a result, any water included in liquid crystal or permeating through a gap in a sealing adhesive does not attach to the surface of the planarizating film 15 over the channel 7. This can prevent polarization and restrain the occurrence of a back channel. That is to say, a threshold voltage of a TFT can be stabilized and, therefore, variation of brightness over the surface of a liquid crystal display panel can be reduced.

Furthermore, even if a back channel occurs in a particular point in a pixel by polarization caused by water, a write voltage in an amount that should actually be applied to the LCD is applied to the upper portions of the channel in each of the pixels in a display pixel area by a display electrode or drain electrode, and accordingly, the influence of polarization on display is reduced by the resulting shielding effect.

Figure 5:
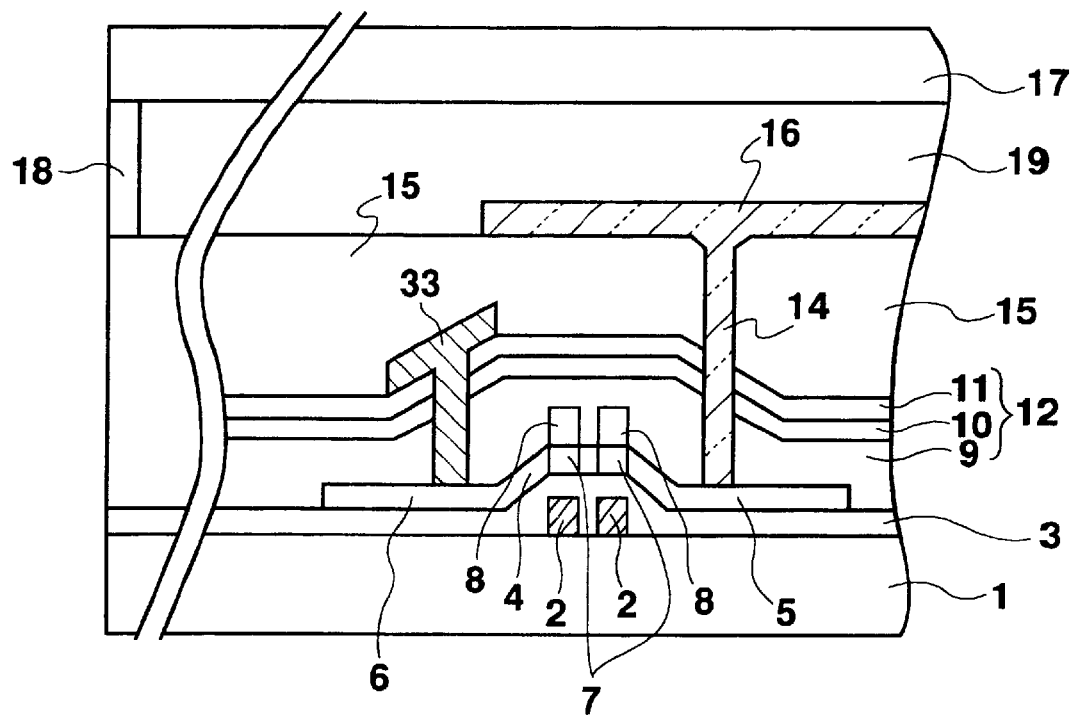
FIG. 5 is a cross-sectional view of an LCD of the present invention.

FIG. 5 shows an LCD using the above described TFT. In this case, the TFT has structure in which a display electrode is placed on a planarizating film over a channel, as shown in FIG. 4, and the LCD has structure in which an insulating substrate 1 the TFT is formed on and an opposite substrate 17 opposite to the insulating substrate 1 are bonded together at their edges with a sealing adhesive 18 and a vacant space formed by the substrates 1 and 17 is filled up with liquid crystal 19.

Therefore, the accumulation of electric charge on the surface of an interlayer insulating film or a planarizating film or polarization between the top and the bottom of a planarizating film can be prevented, leading to a stable TFT threshold voltage. As a result, the bright point defect and others can be improved and an LCD which can perform display having uniform brightness all over can be obtained.
(Second preferred embodiment)

A second embodiment of the present invention will be described below.

Figure 6:
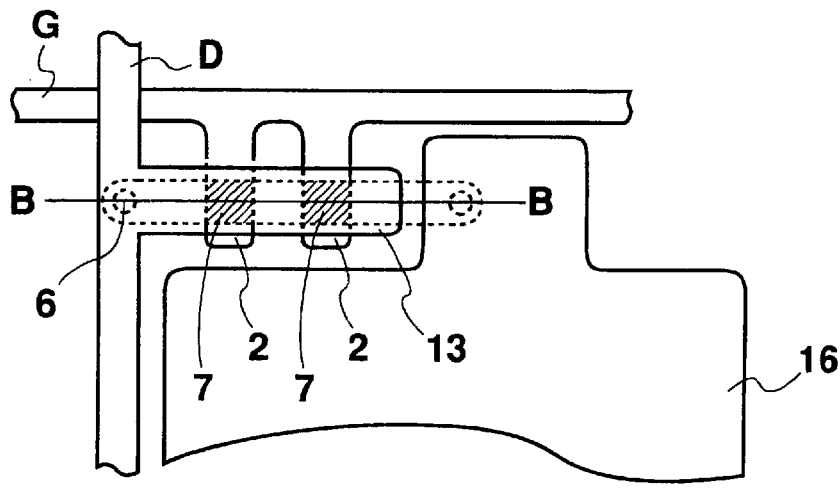
FIG. 6 is a plan view of a TFT of the present invention.
Figure 7:
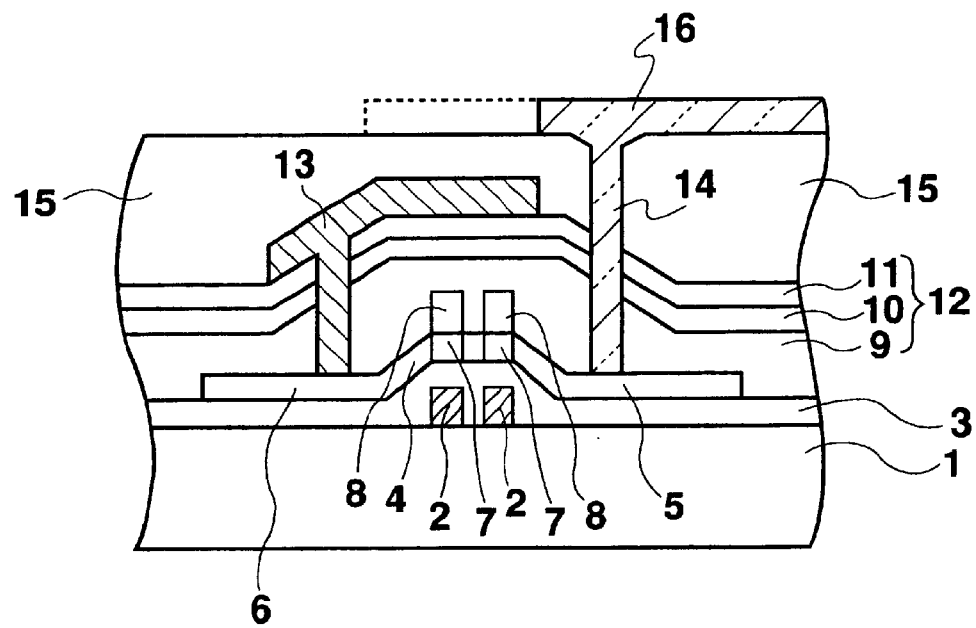
FIGS. 7 and 8 are cross-sectional views of TFTs of the present invention.

FIG. 6 is a plan view of a TFT in accordance with the second embodiment of the present invention; FIG. 7 is a cross-sectional view along B—B line in FIG. 6. As shown in FIG. 7, the structure of a TFT in accordance with the second embodiment corresponds to that of a TFT in accordance with the first embodiment up to the formation of the interlayer insulating film 12. However, there is a difference in the structure of a TFT between the first and second embodiments; the display electrode 16 spreads over at least the channel 7 in a TFT in accordance with the first embodiment, while a drain electrode 13 spreads over at least a channel 7 in a TFT in accordance with this embodiment.

The drain electrode 13 is formed by filling a contact hole over a source 6 with Al so that the drain electrode 13 spreads over the channel 7. In addition, forming a planarizating film 15 and a display electrode 16 in turn will complete a TFT. Even if polarization occurs as a result of water included in liquid crystal or permeating through a gap in a sealing adhesive attaching to the surface of the planarizating film 15 over the channel 7, potential of an interlayer insulating film 12 is determined by the drain electrode 13 formed so that it spreads over the channel 7, and, therefore, polarization can be prevented from occurring in the interlayer insulating film 12. As a result, the occurrence of a back channel can be restrained.

Furthermore, even if a back channel occurs in a particular point in a pixel by polarization due to a cause such as water, a write voltage in an amount that should actually be applied to the LCD is applied to the upper portions of the channel in each of the pixels in a display pixel area by a display electrode or drain electrode, and accordingly, the influence of polarization on display is reduced by the resulting shielding effect.

Figure 8:
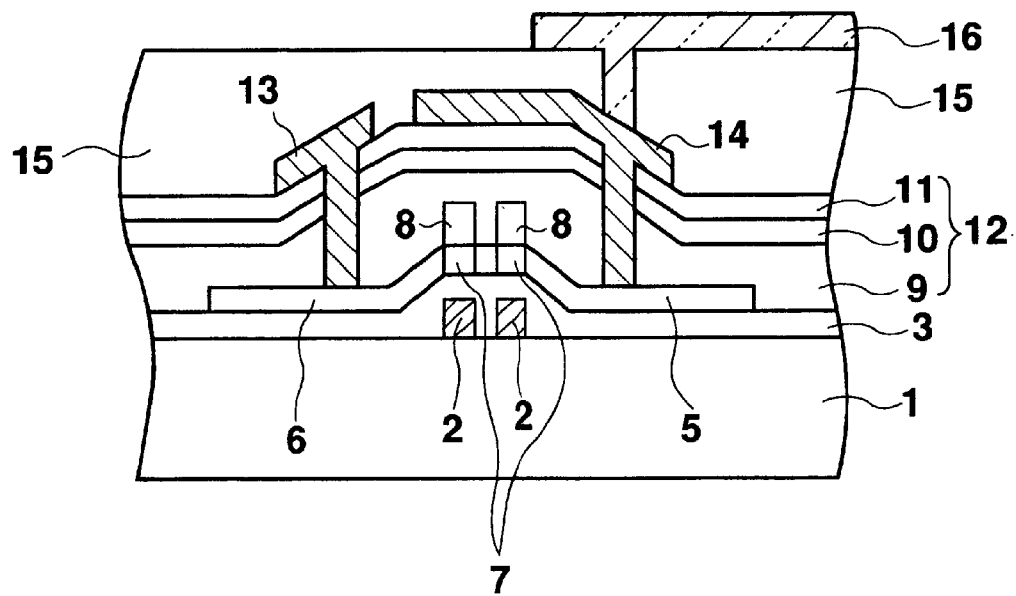

That is to say, a threshold voltage of a TFT can be stabilized and, therefore, variation of brightness over the surface of a liquid crystal display panel can be reduced. In this embodiment, the drain electrode 13 is formed so that it spreads over the channel 7. As shown in FIG. 8, however, a drain electrode 13 and a source electrode 14 are formed using Al at the same time and the formed source electrode 14 may spread over the channel 7. A display electrode 16 will be in contact with the source electrode 14 made of Al via a contact hole formed in a planarizating film 15.

In the structure shown in FIG. 7, the display electrode 16 can also be formed on the planarizating film 15 so that it covers an area over the channel 7 (shown by a dotted line in FIG. 7). In an LCD using such a TFT, a back channel can be prevented more effectively. Therefore, an area in the planarizating film 15 over the channel 7 is protected by the display electrode 16 and, therefore, the planarizating film 15 will not be exposed to the air, liquid crystal, or others, which can prevent polarization and a back channel caused by polarization more reliably.

If a TFT in accordance with this second preferred embodiment is applied to an LCD, it will have the same structure as, for example, that of the LCD shown in FIG. 5 with the exception that the TFTs are replaced by those shown in FIG. 6.

In addition, although in each of the above preferred embodiments, a TFT used in a pixel portion in a display area of an LCD is described, the present invention is not limited to such a TFT. That is to say, the present invention is also applicable to a TFT in a driving circuit around a display area for providing scan signals or image signals to the display area. In this case, an ITO film is formed on an interlayer insulating film in a TFT in a driving circuit. Potential of this ITO film may be floating or be equal to that of an opposite electrode on its opposite substrate.

In such a case, variation of a threshold voltage of a TFT will be eliminated as with a TFT in a pixel portion and each signal can be provided stably to a display area, resulting in high-quality display.

Furthermore, in each of the preferred embodiments, a TFT having two gates, known as the double-gate structure, is described, but, according to the present invention, the same effect will be obtained with a TFT having one gate, known as the single-gate structure.

While what have been described are, at present, considered to be preferred embodiments of the invention, it will be understood that various modifications may be made thereto, and it is intended that the appended claims cover all such modifications falling within the true spirit and scope of the invention.

What is claimed is:

1. A thin film transistor comprising:
    a substrate;
    a gate electrode;
    a gate insulating film;
    a poly silicon film having a channel;
    an interlayer insulating film;
    a source electrode and a drain electrode; and
    a planarizating film;
        wherein the gate electrode, the gate insulating film, the poly silicon film having a channel, the interlayer insulating film, the source electrode and the drain electrode, and the planarizating film are formed on the substrate in that order;
        wherein one of the source electrode and the drain electrode is formed on the interlayer insulating film spreading over at least the channel; and
        wherein one of the source electrode and the drain electrode is disposed over the gate electrode so as to prevent a back channel from occurring.

2. The thin film transistor according to claim 1, wherein the substrate, on which the thin film transistor is formed, is used in a liquid crystal display for displaying a desired image by driving liquid crystal sealed in between a pair of substrates, as one of the pair of substrates, and wherein the upper surface of the planarizating film is placed opposite to the other of the pair of substrates with the liquid crystal between.

3. The thin film transistor according to claim 1, wherein a transparent electrode is formed on the planarizating film, and wherein the transparent electrode covers at least an area in the planarizating film over the channel.

4. The thin film transistor according to claim 1, further comprising a stopper insulating film formed between the poly silicon film and the interlayer insulating film in such a way that the stopper insulating film covers the channel in the poly silicon film.

\* \* \* \* \*

UNITED STATES PATENT AND TRADEMARK OFFICE
CERTIFICATE OF CORRECTION

PATENT NO. : 6,365,915 B1
DATED : April 2, 2002
INVENTOR(S) : Hirai et al.

It is certified that error appears in the above-identified patent and that said Letters Patent is hereby corrected as shown below:

Title page,
Item [75], Inventors, after "Hirai," delete "Hashima;" and insert therefor -- Gifu; --.
Item [56], References Cited, U.S. PATENT DOCUMENTS, "5,955,765" reference, delete "9/1998" and insert therefor -- 9/1999 --.

Signed and Sealed this

Twentieth Day of September, 2005

JON W. DUDAS
*Director of the United States Patent and Trademark Office*